(12) United States Patent
Pekny

(10) Patent No.: US 6,731,551 B2
(45) Date of Patent: May 4, 2004

(54) TESTING MEMORY USING A STRESS SIGNAL

(75) Inventor: Theodore T. Pekny, Miltitas, CA (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 10/192,390

(22) Filed: Jul. 10, 2002

(65) Prior Publication Data

US 2004/0008553 A1 Jan. 15, 2004

(51) Int. Cl.7 .................................................. G11C 7/00
(52) U.S. Cl. ........................................ 365/201; 365/200
(58) Field of Search ................................. 365/201, 200

(56) References Cited

U.S. PATENT DOCUMENTS 6,242,936 B1 * 6/2001 Ho et al. .................... 324/765
6,396,742 B1 * 5/2002 Korsh et al. ............ 365/185.22
6,459,634 B1 * 10/2002 Sher ........................... 365/201

* cited by examiner

Primary Examiner—M. Tran
(74) Attorney, Agent, or Firm—Williams, Morgan & Amerson, P.C.

(57) ABSTRACT

A method and apparatus is provided for testing a memory portion using a stress signal. The method comprises identifying a first and second portion of a memory, wherein a stress signal is to be applied to only the second portion of the memory. The first portion is isolated from exposure to a stress signal. A stress signal is provided to the second portion of said memory for testing said second portion of memory. The first portion of said memory is isolated from said stress signal. The method further comprises performing an alternate wordline testing process.

30 Claims, 10 Drawing Sheets

TESTING MEMORY USING A STRESS SIGNAL

BACKGROUND OF THE INVENTION

1. Field of the Invention

This invention generally relates to a semiconductor memory device, and, in particular, to testing memory using wordline testing based upon a stress signal.

2. Description of the Related Art

Modern integrated circuit devices are comprised of millions of semiconductor devices, e.g., transistors, formed above a semiconductor substrate, such as silicon. These devices are very densely packed, i.e., there is little space between them. Similarly, densely packed electrically conducting lines may also be formed in the semiconductor substrate. By forming selected electrical connections between selected semiconductor devices and selected conducting lines, circuits capable of performing complex functions may be created. For example, bits of data may be stored by providing electrical current to a plurality of bit lines and an orthogonal plurality of word lines that may be electrically coupled to one or more capacitors in a semiconductor memory.

The semiconductor memory may be a dynamic random access memory, a flash memory, and the like. The semiconductor memory typically comprises an array of memory cells, address decoding circuitry for selecting one, or a group, of the memory cells for reading or writing data, sensing circuitry for detecting the digital state of the selected memory cell or memory cells, and input/output lines to receive the sensed data and convey that information for eventual output from the semiconductor memory. In many cases, the array of memory cells will be sub-divided into several sub-arrays, or subsets, of the complete collection of memory cells. For example, a semiconductor memory having 16 megabits ($2^{24}$ bits) of storage capacity may be divided into 64 sub-arrays, each having 256K ($2^{18}$) memory cells.

Flash memory (sometimes called "flash RAM") is a type of non-volatile memory that can be erased and reprogrammed in units of memory called blocks. Other types of memory may be erased and rewritten in smaller units, such as units at the byte level, which is more flexible, but slower than the block operations of flash memory. Flash memory is commonly used to hold control code such as the basic input/output system (BIOS) in a personal computer. When BIOS needs to be changed (rewritten), the flash memory can be written in block (rather than byte) sizes, making it faster to update. Applications employing flash memory include digital cellular phones, digital cameras, LAN switches, computers, digital set-up boxes, embedded controllers, and other devices.

Although forming the selected electrical connections may enable the circuits to perform their intended functions, undesirable electrical connections may result in a variety of malfunctions, e.g., short circuit paths may be established. Thus, semiconductor devices, such as the capacitors in memory cells, and conducting lines, such as the input/output lines, may generally be electrically isolated. For example, to insure that devices, lines, and/or groups thereof may form the semiconductor memory are properly isolated, modern semiconductor processing involves the formation of shallow trench isolations (STI) in various regions of the substrate. These shallow trench isolations are typically formed by etching a trench in the semiconductor substrate and, thereafter, filling the trench with an isolation material, e.g., an insulator, such as silicon dioxide, silicon oxynitride, silicon nitride, or other like materials. However, it may be difficult to completely isolate the devices and/or lines. For example, defects in the semiconductor substrate or in the manufacturing process may form an undesirable conducting path between the devices and/or lines in the semiconductor memory that may cause the semiconductor memory to malfunction.

Generally, memory devices manufactured on semiconductor wafers are processed through a plurality of testing procedures. The quality of memory devices manufactured may depend upon the number of errors that are discovered while testing memory cells in the memory devices. Sections of memory are tested and areas of defects are identified for repairs and/or analysis. One method of testing memory is to provide a stress voltage signal to provide a stress condition for sections of a memory cell. For example, a stress voltage may be applied across selected rows or columns in a memory in order to test the resiliency of the components that make up the memory in the sections being tested. An example is a test to provide a positive stress voltage to alternate rows in a memory. For example, even-numbered wordlines may be grounded while the odd-numbered, opposite-row wordlines, are subjected to a positive stress voltage. Using this process, a plurality of wordlines in a memory device can be tested in a simultaneous fashion.

One problem that arises from the alternate wordline testing described above is that the stress voltage source may collapse due to shorted or repaired rows. Certain errors in the rows may cause a short to occur, shorting the stress voltage supply, thereby disrupting the testing procedure. An inability to perform efficient alternate wordline testing can cause increased costs in testing of memory and can make testing dense memory, such as flash memory, DRAMs, and other types of memory, more difficult.

SUMMARY OF THE INVENTION

In one aspect of the instant invention, a method is provided for testing a memory portion using a stress signal. The method comprises identifying a first and second portion of a memory, wherein a stress signal is to be applied to only the second portion of the memory. The first portion is isolated from exposure to a stress signal. A stress signal is provided to the second portion of said memory for testing said second portion of memory. The first portion of said memory is isolated from said stress signal.

In another aspect of the instant invention, an apparatus is provided for testing a memory portion using a stress signal. The apparatus of the present invention comprises a memory unit, a stress signal unit and a controller. The memory unit comprises a plurality of memory sectors. The stress signal unit is operatively coupled to the memory unit. The stress signal unit is adapted to provide a stress signal to the memory unit. The controller is operatively coupled with the memory unit and the stress signal unit. The controller is adapted to perform an alternate memory-sector stress signal test upon the memory unit and isolate at least one memory sector from exposure to the stress signal.

In yet another aspect of the instant invention, a system is provided for testing a memory portion using a stress signal. The system of the present invention comprises a memory unit, a stress voltage supply and an access unit. The memory unit comprises a plurality of wordlines. The stress voltage supply is operatively coupled to the memory unit. The stress voltage supply provides a stress voltage to the memory unit.

The access unit is operatively coupled to the memory unit. The access unit is adapted to perform an access of a portion of the memory unit and perform an alternate wordline stress voltage test upon the memory unit while isolating at least one pre-selected wordline, by providing a stress voltage to a plurality of wordlines, in the memory unit and isolating the pre-selected wordline.

BRIEF DESCRIPTION OF THE DRAWINGS

The invention may be understood by reference to the following description taken in conjunction with the accompanying drawings, in which like reference numerals identify like elements, and in which.

Figure 1:
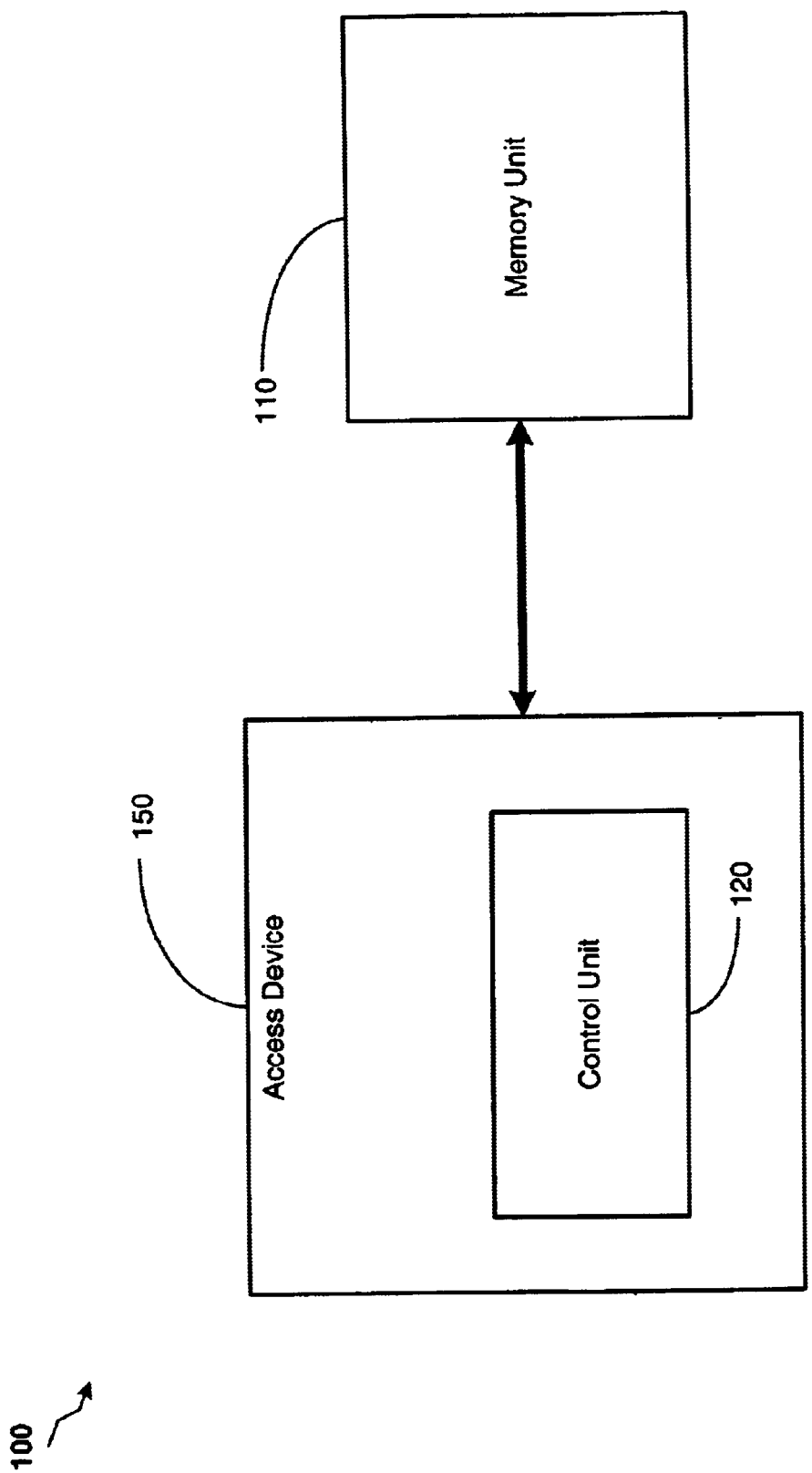
FIG. 1 is a block diagram of a system including a device that is capable of accessing and/or testing a memory, in accordance with one embodiment of the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Testing is an important aspect of manufacturing of memory devices. Generally, before a set of memory devices is sent out of the manufacturing section, a plurality of tests may be performed on the memory devices to insure viability of the devices. For example, wordline stress tests may be applied to one or more lines in the memory device. However, errors or defects in particular memory sections may disrupt the entire stress test by disrupting the source of the stress voltage. Embodiments of the present invention call for providing a safeguard against particular defective sections of memory from disrupting the source voltage. Embodiments of the present invention provide for protecting a particular section of memory, such as a particular wordline or a section of a wordline, so that stress voltage applied to the entire wordline is not applied to that particular section of the wordline. By employing the embodiments of the present invention, entire wordlines in a memory unit may be tested without disruptions from any potentially defective sections of the wordline.

Referring to FIG. 1, a block diagram of a system 100 is illustrated, in accordance with one embodiment of the present invention. The system 100 comprises a memory unit 110 capable of storing data, which may be accessed by an access device 150. The access device 150 comprises a control unit 120 capable of accessing data (including code) stored in the memory unit 110. The access device 150 may be any device that uses the memory unit 110 to store data, read data, or both. Examples of the access device 150 may include, but are not limited to, a computer, a camera, a telephone, a television, a radio, a calculator, a personal digital assistant, a network switch, a setup-box, and the like.

The control unit 120, in one embodiment, may manage the overall operations of the access device 50, including writing and reading data to and from the memory unit 110. The control unit 120 may comprise a microprocessor, a microcontroller, a digital signal processor, a processor card (including one or more microprocessors or controllers), a memory controller, or other control or computing devices.

The memory unit 110 in the illustrated embodiment is a non-volatile memory, such as flash memory. In one embodiment, the memory unit 110 may be an external memory, such as a memory stick; and may be accessed when inserted into a slot (not shown) of the access device 150. When inserted into the access device 150, the access device 150 provides the appropriate power and control signals to access memory locations in the memory unit 110. The memory unit 110 may be external to, or internal (e.g., integrated) to, the access device 150. The access device 150, such as a computer system, may employ a memory unit 110 that is integrated within the computer systems to store data (e.g., BIOS [basic input/output system]) related to the computer system.

Figure 2:
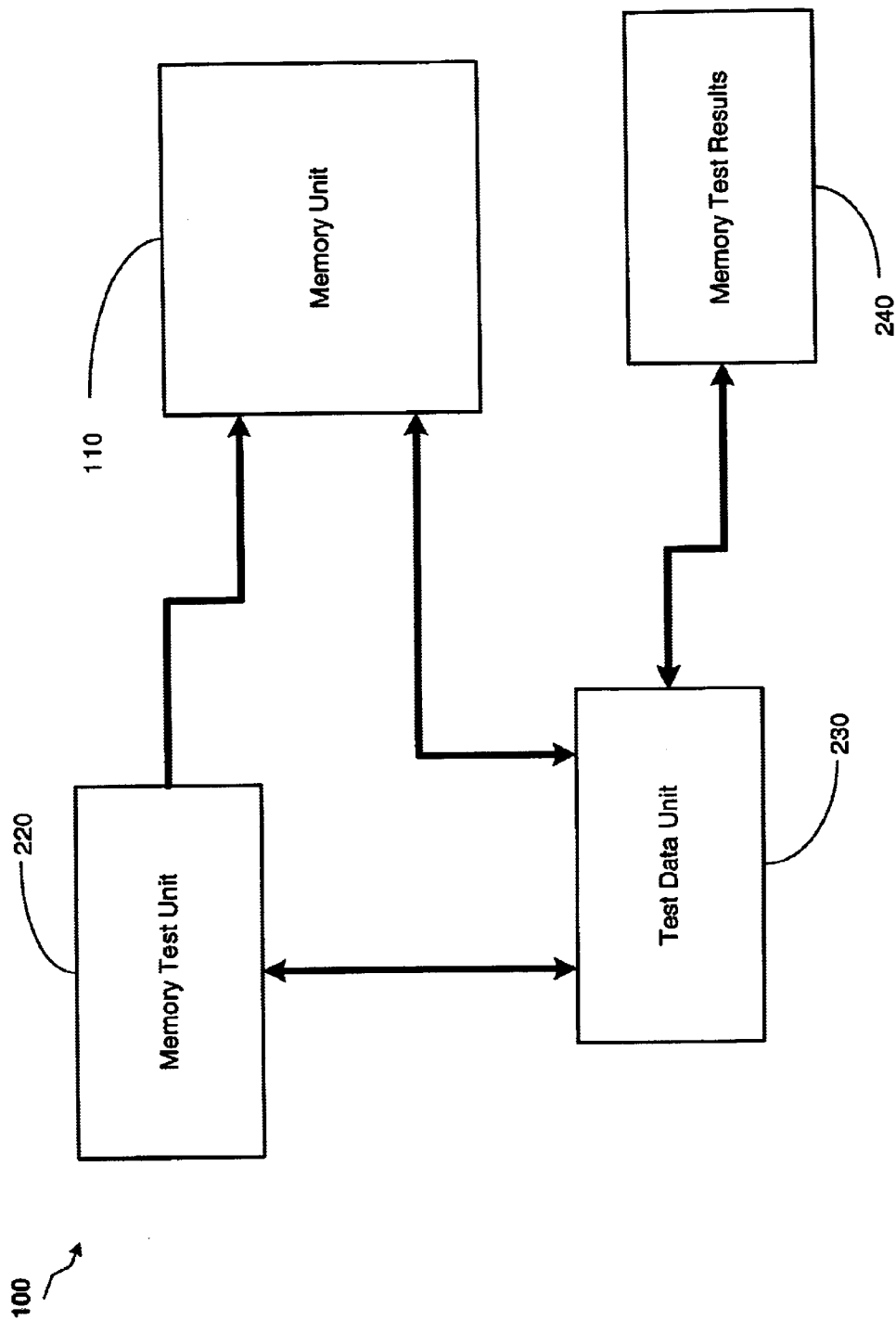
FIG. 2 is a block diagram representation of a system for performing an alternate wordline testing of memory, in accordance with one illustrative embodiment of the present invention.

Turning now to FIG. 2, a block diagram depiction of the implementation of one embodiment of at least a portion of the control unit 120 is illustrated. FIG. 2 illustrates a system 100 that comprises a memory test unit 220 and a test data unit 230. Generally, the memory test unit 220 performs one or more tests on the memory unit 110, and the test data unit 230 produces test results relating to testing of the memory unit 110. The memory test unit 220 and the test data unit 230 are interfaced with the memory unit 110. The memory test unit 220 performs one or more memory tests upon one or more portions of memory in the memory unit 110. The test data unit 230 processes test data resulting from testing performed by the memory test unit 220. The test data unit 230 collects test data relating to the memory unit 110 and generates memory test results 240. The memory test results 240 may be analyzed to determine the viability of a particular memory device. The memory test results 240 may be analyzed to provide indications of sections in the memory that may benefit from repair or other rework.

Figure 3:
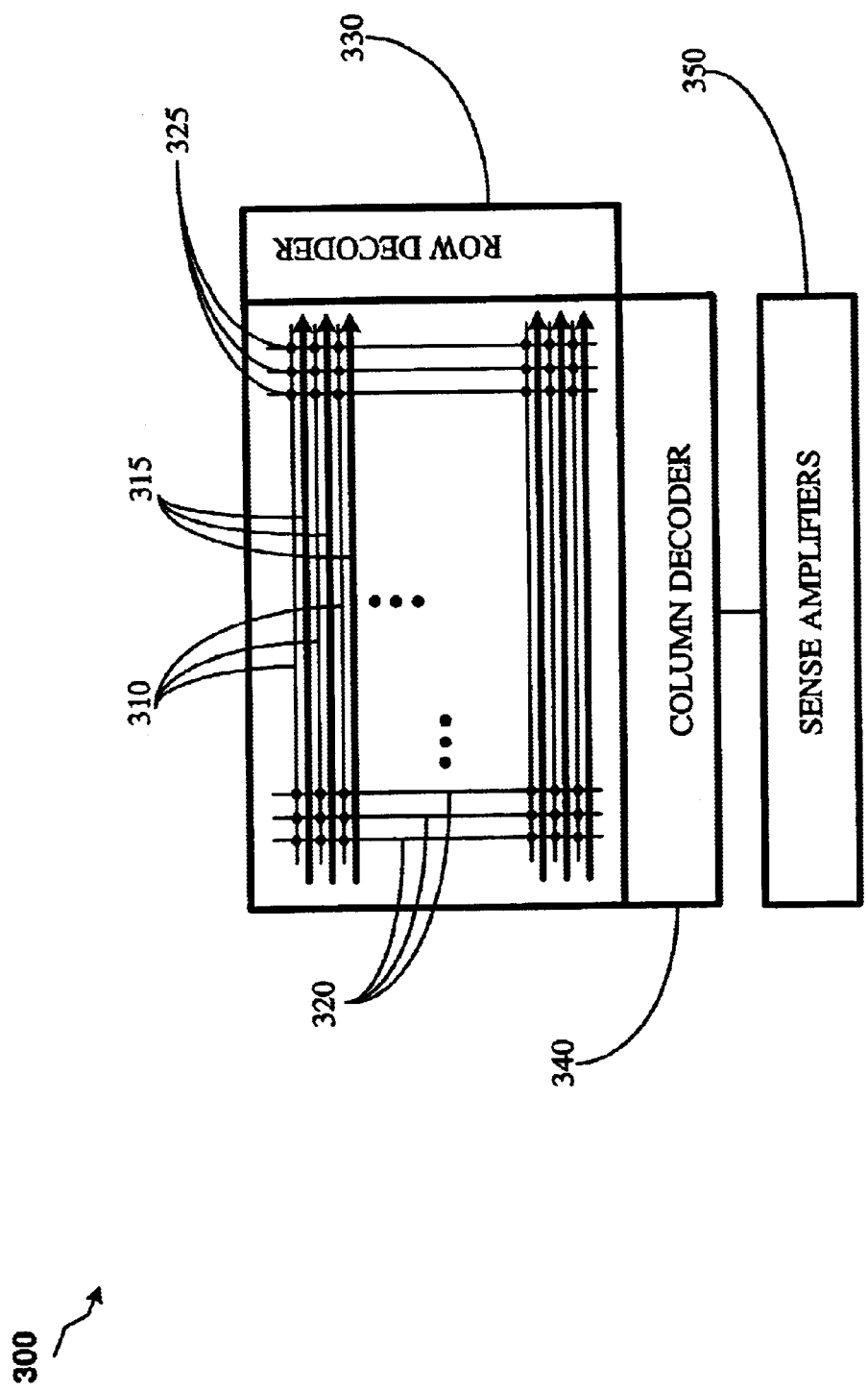
FIG. 3 illustrates a simplified depiction of a semiconductor memory array in the memory unit of FIG. 2, in accordance with one illustrative embodiment of the present invention.

Turning now to FIG. 3, an exemplary arrangement of a semiconductor memory array 300 in the memory unit 110, which may include one or more semiconductor memory arrays 300, is illustrated. The semiconductor memory array 300 includes a plurality of memory cells 325. For example, the semiconductor memory array 300 may include, in one embodiment, 256K ($2^{18}$) memory cells 325. The memory cells 325 may be coupled to a plurality of rows 310 and columns 320. For example, the semiconductor memory array 300 may include 512 ($2^9$) rows 310 and 512 columns 320. Each column 320 may be coupled to 512 memory cells 325, i.e., there is one memory cell 325 for each of the 512 rows 310.

A row decoder 330 may receive row address signals, which may activate selected row(s) 310 in the semiconductor memory array 300. A column decoder 340 may receive column address signals and, based on those signals, may select a particular column 320 in the semiconductor memory array 300. In one embodiment, the column decoder 340 may operatively couple a particular column 320 to one or more sense amplifiers 350. The selection of the row 310 and the column 320 will result in the sensing of the logical state of the memory cell 325 located at the intersection of that row 310 and column 320. The signal representing the logical state of that memory cell 325 may then be coupled to a selected input/output line 315. The input/output lines 315 may, in one embodiment, traverse the semiconductor memory array 300 in a direction parallel to the rows 310 and perpendicular to the columns 320. The input/output lines 315 may exit the semiconductor memory array 300 via the row decoder 330. The access device 150 may access portions of the memory unit 110 via the input/output lines 315.

The components of the semiconductor memory array 300, such as the rows 310, columns 320, and memory cells 325, are generally electrically isolated from each other. Although not so limited, in one embodiment, the components may be electrically isolated from each other by forming shallow trench isolations. (STI) in various regions of the substrate. It may, however, be difficult to completely isolate the devices (e.g. the memory cells 325) and/or lines 310, 320, 315. For example, defects in the semiconductor substrate or in the manufacturing process may form an undesirable conducting path between the devices and/or lines 310, 320, 315 in the semiconductor memory array 300 that may cause the semiconductor memory array 300 to malfunction. Other errors may exist in portions of the rows 310 and/or columns 320, which may form a wordline. Embodiments of the present invention provide for testing the wordlines using an alternate wordline test process, which applies a stress signal (e.g., a stress voltage signal) to alternate wordlines while isolating preselected sections of the memory unit 110 from exposure to the stress signal.

Since separate access to the rows 310 and/or columns 320 may be made, selective testing of particular rows 310 and/or columns 320 may be performed. In addition, the row decoder 330 and the column decoder 340 may be used to pinpoint particular sections in the memory unit 110 that may be the subject of memory testing. For example, applying a stress voltage to the entire row 310 may test all the memory sections of an individual row 310. Furthermore, the row decoder 330 may be used to apply a stress voltage to a plurality of the rows 310 in a simultaneous fashion. For example, a stress voltage may be applied to alternate rows 310 in the memory unit 110. Therefore, the memory unit 110 may be tested in an efficient manner. However, errors in a particular row 310 may disrupt the source that provides the stress voltage, thereby disrupting the test performed on the memory unit 110. Embodiments of the present invention provide for safeguards in preventing damaged sections within the memory unit 110 from disrupting the source that provides the stress voltage.

Figure 4:
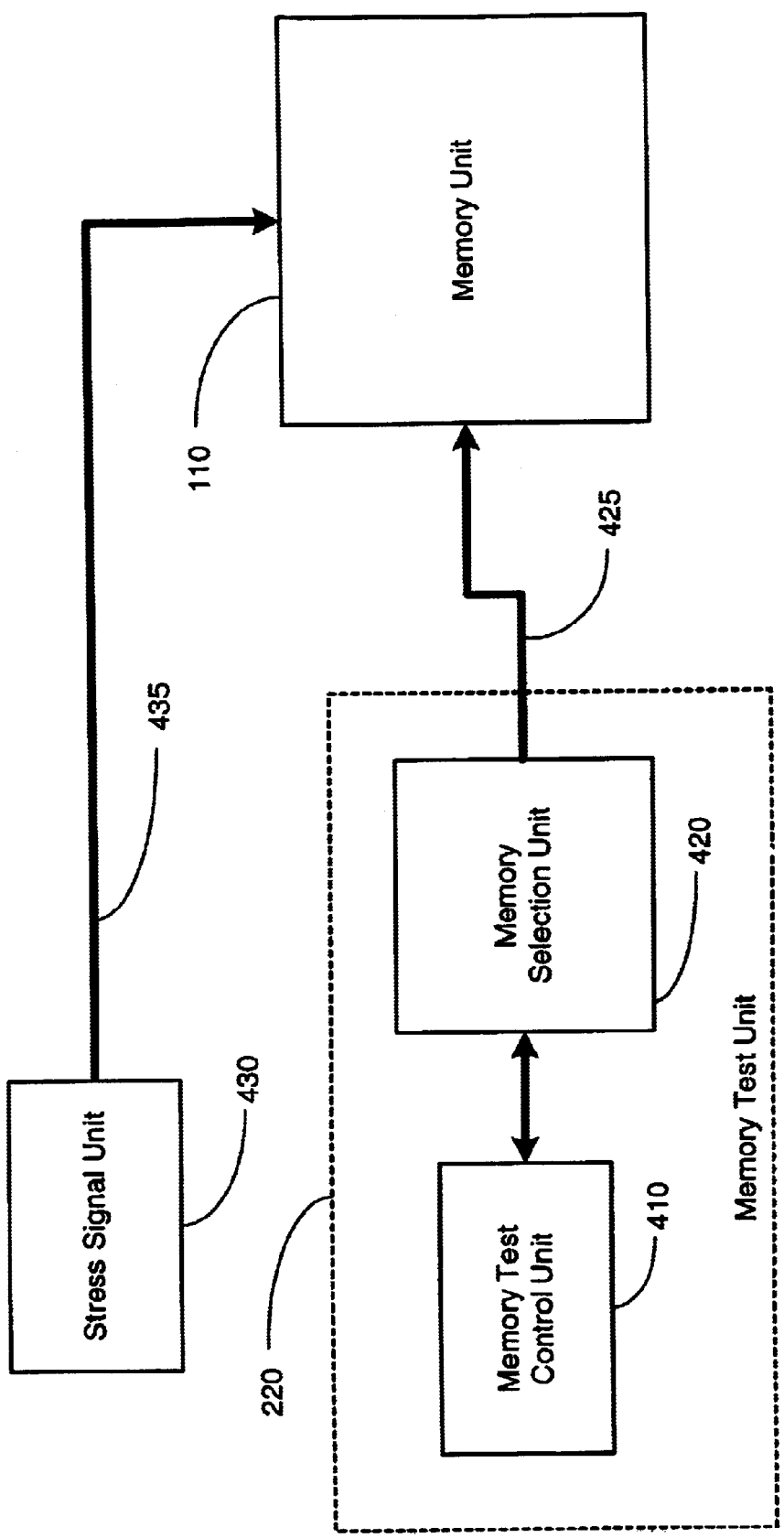
FIG. 4 illustrates a block diagram representation of a memory test unit of FIG. 2, in accordance with one illustrative embodiment of the present invention.

Turning now to FIG. 4, a more detailed illustration of the memory test unit 220 and its connection with the memory unit 110 is illustrated. In one embodiment, the memory test unit 220 comprises a memory test control unit 410 and a memory selection unit 420. The memory selection unit 420 selects particular memory locations in the memory unit 110 that are to be tested. Addressing information relating to the memory locations to be tested is sent to the memory unit 110 on a line 425. The data on the line 425 is used to protect particular sections of the memory unit 110, such as particular sectors of a wordline in the memory unit 110, from receiving a stress signal (e.g., stress voltage signal) provided by a stress signal unit 430. In one embodiment, the stress signal unit 430 provides a voltage signal in the range of approximately 6 to 11 volts on a line 435, which is applied to alternate wordlines in the memory unit 110. It should be appreciated by those skilled in the art that other voltage levels may be used to provide stress upon a wordline.

The memory test control unit 410 determines the type of tests to be applied on the memory unit 110 and provides information to the memory selection unit 420 relating to which memory locations are to be protected from the stress signal. The memory test control unit 410 activates the stress signal unit 430, which prompts it to engage the stress voltage signal that is sent to the memory unit 110 on the line 435. The memory selection unit 420 protects sectors within particular wordlines in the memory unit 110 from the stress voltage, which is applied to the alternate wordlines in the memory unit 110. Protecting particular defective sections of wordlines in the memory unit 110 reduces the probability that the defective portions would disrupt the operation of the stress signal unit 430. In one embodiment, protected portions of the wordlines are not exposed to the stress voltage, thereby reducing the probability that defective portions of the memory unit 110 would short-circuit a signal source (e.g., a voltage supply) that generates the stress signals.

Figure 5:
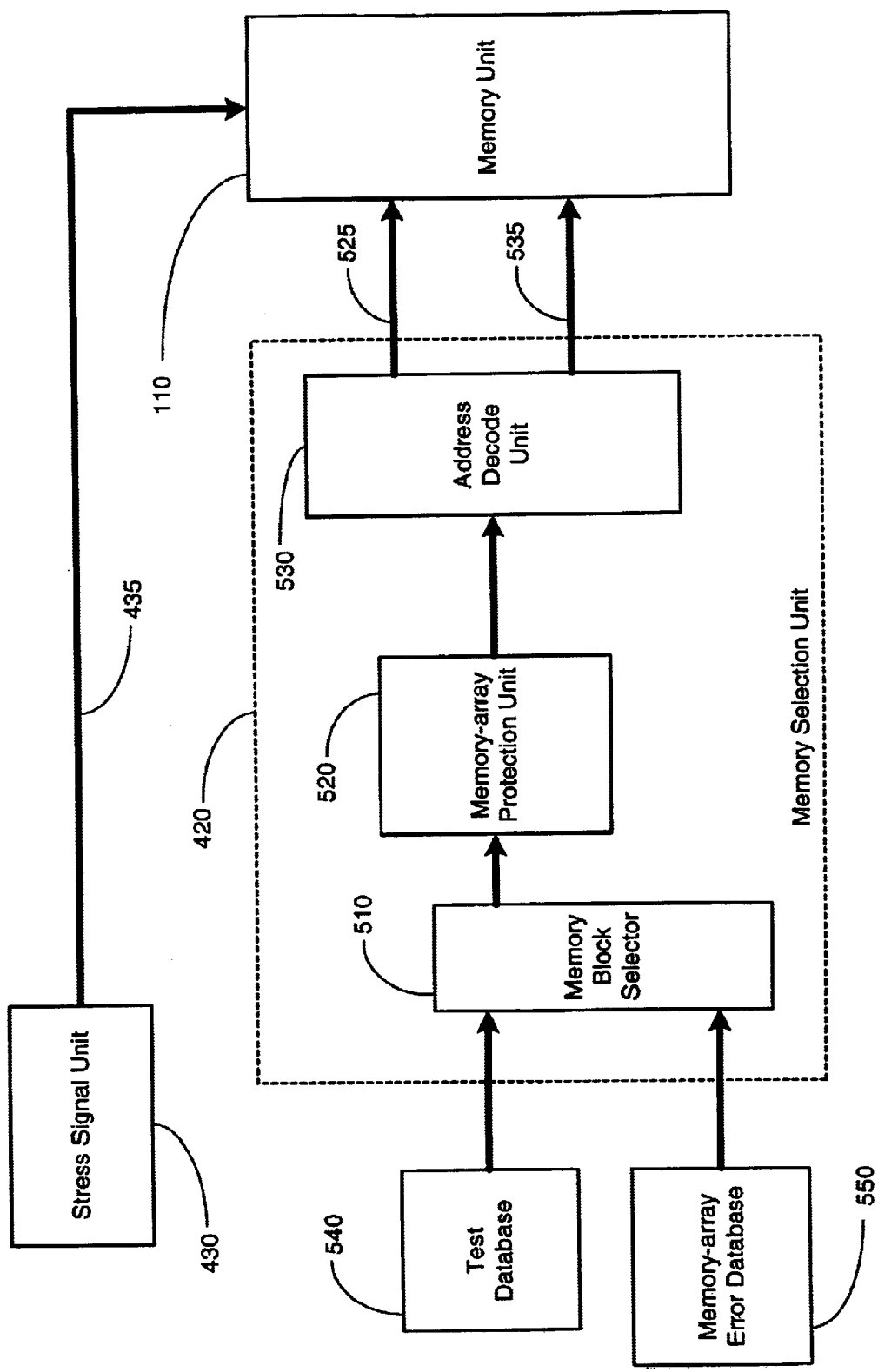
FIG. 5 illustrates a block diagram representation of a memory selection unit of FIG. 2, in accordance with one illustrative embodiment of the present invention.

Turning now to FIG. 5, a more detailed depiction of the memory selection unit 420 and its connection with the memory unit 110 is illustrated. The memory selection unit 420 provides the address in the memory unit 110 that is to be protected from the voltage produced by the stress signal unit 430. The memory selection unit 420 provides an additional control signal that is used by the memory unit 110 to protect particular sectors in the memory unit 110. For example, the memory selection unit 420 may provide a block select block protect (BSBP) signal to the memory unit 110 on a line 535. The BSBP signal may indicate to the memory unit 110 to protect a particular block of memory. The BSBP signal may become active, or asserted, for a particular address location, the address of which is provided by the memory selection unit 420 on a line 525.

The memory selection unit 420 comprises a memory block selector 510, a memory-array protection unit 520, and an address decode unit 530. The memory block selector 510 receives test and quality information regarding the memory unit 110 from a test database 540 and/or a memory-array error database 550. In one embodiment, the test database 540 and the memory-array error database 550 may be combined into a single database. The test database 540 provides data relating to test results of tests performed on the memory unit 110 prior to the implementation of the stress test. The memory-array error database 550 provides data relating to any errors or defects that may be present in particular locations in the memory unit 110.

The memory block selector 510 examines the memory test data and defect data relating to the memory unit 110 to determine memory locations that may be susceptible to problems if of a stress signal test is applied thereto. The memory-array protection unit 520 receives the processed memory test and memory defect data from the memory block selector 510. The memory block selector 510 also selects particular blocks of the memory unit 110 that should be exempted from the stress signal test to avoid compromising the implementation of the stress test. In other words, the memory block selector 510 identifies memory locations, based upon test/defect data, which may cause a stress signal source in the stress signal unit 430 to become shorted or otherwise prevents proper testing.

The memory-array protection unit 520 receives the processed memory test and memory defect data from the memory block selector 510. The memory-array protection unit 520, or a controller (not shown) with the system 100, determines particular addresses in the memory unit 110 that should be excluded from the stress test. The memory-array protection unit 520 receives the blocks of memory that should be exempted from the stress test and generates addresses that are to be protected from the stress test. The address decode unit 530 receives the addresses that are to be protected from the stress test from the memory-array protection unit 520. The address decode unit 530 then decodes the addresses to be protected and provides sector addresses in the memory unit 110 that are to be protected from the implementation of the stress test. The sector address is sent to the memory unit 110 on the line 525.

Furthermore, in addition to the sector address, the address decode unit 530 provides a block select block protect signal that, when asserted, will direct a control circuit within the memory unit 110 to exempt a particular sector/section of memory in the memory unit 110 from receiving the stress signal during the implementation of the stress test. In one embodiment, when the BSBP signal is asserted to a logic low level on a line 535, the memory unit 110 to exempts that particular address identified on the line 525 from being exposed to the stress signal during the implementation of the stress signal test process.

Figure 6:
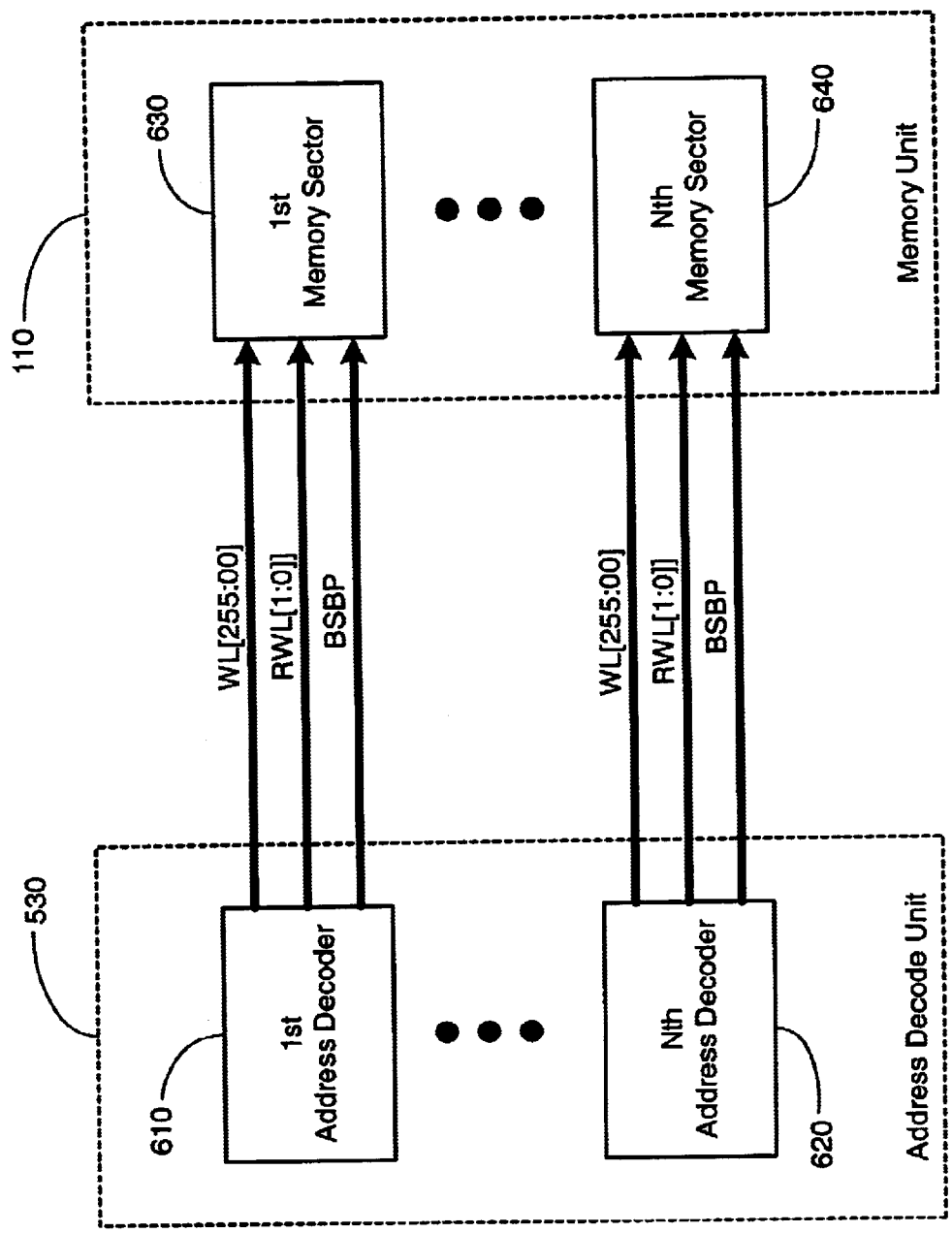
FIG. 6 illustrates a block diagram representation of an address decoder unit of FIG. 5, in accordance with one illustrative embodiment of the present invention.

A more detailed illustration of one embodiment of the address decode unit 530 and the memory unit 110 are shown in FIG. 6. The address decoder unit 530 may comprise a plurality of address decode units (a first address decode unit 610 through an $n^{th}$ sector decode unit 620). The address decode units 610, 620 correspond to particular sections of memory in the memory unit 110, i.e., the memory unit 110 may comprise a plurality of addressable memory sectors 630, 640 (a first memory sector 630 through an nth memory sector 640). Therefore, each address decode unit 610, 620 may correspond to each memory-sector 630, 640. For example, the first address decode unit 610 is able to address and select the first memory sector 630, and the nth address decode unit 620 is capable of accessing the nth memory sector 640 in the memory unit 110.

Based upon data from the memory block selector 510 and the memory-array protection unit 520, the address decode unit 530 selects particular memory sectors 630,640 in the memory unit 110 to be exempted from exposure to signals related to the stress testing. Therefore, in one embodiment, the address decode units 610, 620 generate a wordline address that may comprise 256 wordlines that addresses specific wordlines in the memory sectors 630, 640. Along with particular wordline addresses, the address decoder units 610, 620 may provide a BSBP signal that corresponds to the addressed wordline in the particular memory sectors 630, 640. This method is used to isolate or exempt particular wordlines within a memory sector 630, 640, or exempt an entire memory sector 630, 640 altogether, from exposure to the stress voltage during the stress voltage-testing phase.

Based upon the selected wordline addresses and the BSBP signals generated by the address decode units 610, 620, certain locations and/or wordlines in the memory sectors 630, 640 are exempted from the stress signal. Generally, the exempted wordlines may contain particular defects, electrical shorts, or other faults that may short the stress signal and/or otherwise interfere with the ability to implement the stress voltage test. For example, a short in a particular wordline may cause the implemented stress voltage in the memory unit 110 to become shorted, thereby causing the source of the stress voltage in the stress signal unit 430 to become shorted, which disrupts the stress test process. Therefore, based upon known defects and problems that may exist in particular sections in the memory unit 110, the system 100 is capable of isolating particular wordlines or blocks or sectors of memory in the memory unit 110 to be exempt from the exposure to the stress signal, while at the same time, providing the ability to test all other memory locations/wordlines in the memory unit 110.

Those skilled in the art will appreciate that while the illustrative embodiment described herein has been in the context of blocks of memory, the instant invention admits to wider application. That is, the memory unit 110 may be subdivided into portions of various sizes other than blocks without departing from the spirit and scope of the instant invention. The principles of the instant invention may be applied to isolate select portions of the memory, where these portions may be any convenient size.

Figure 7:
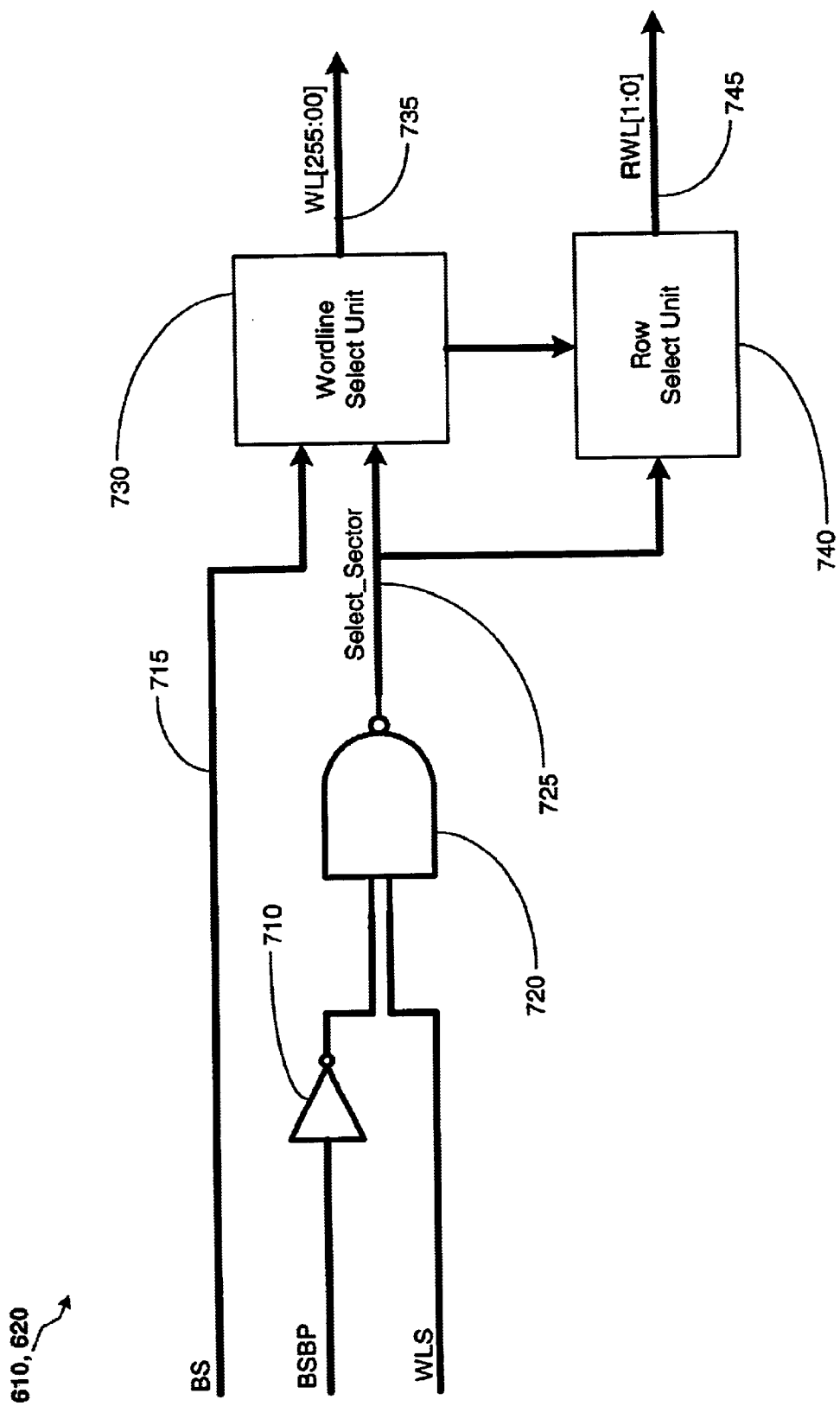
FIG. 7 illustrates a block diagram representation of an address decoder of FIG. 6, in accordance with one illustrative embodiment of the present invention.

Turning now to FIG. 7, a simplified block diagram depiction of the implementation of address decode units 610, 620 is illustrated. The address decode units 610, 620 receive three main signals: block select (BS), block select block protect (BSBP), and wordline select (WLS). In order to protect a particular wordline, wordline select (WLS) is asserted to address a particular wordline and the signal BSBP is asserted low. The sector is selected by the assertion of BS. An inverter 710 inverts the BSBP signal to cause the BSBP signal to become a negative true, or an active-low signal. The inverted BSBP and WLS signals are sent to a NAND gate 720, which produces an active-low signal (select_sector) on a line 725. The assertion of the BSBP (asserted low) and WLS signals will assert the select_sector signal, which is an asserted low signal due to the NAND gate 720. The select_sector signal is received by a wordline select unit 730, which produces a wordline address on a line 735. In one embodiment, the wordline address produced on the line 735 is a 16-bit address labeled WL[255:00]. If the particular block is selected by the assertion of the block select signal on a line 715, a row select unit 740 may generate a row wordline select signal on a line 745 (RWL[1;0]), which may also use the select_sector signal on the line 725 to assert RWL[1:01]. Based upon the assertion of the BSBP signal, the wordline select unit 730 and the row select unit 740 provide a wordline address that is used to exempt a portion of the memory unit 110 from having the stress voltage applied upon that particular memory portion. Therefore, vulnerable memory sections in the memory unit 110 to may be protected from exposure to the stress voltage signal, thereby reducing the probability of an electrical short occurring in the stress signal unit 430.

Figure 8:
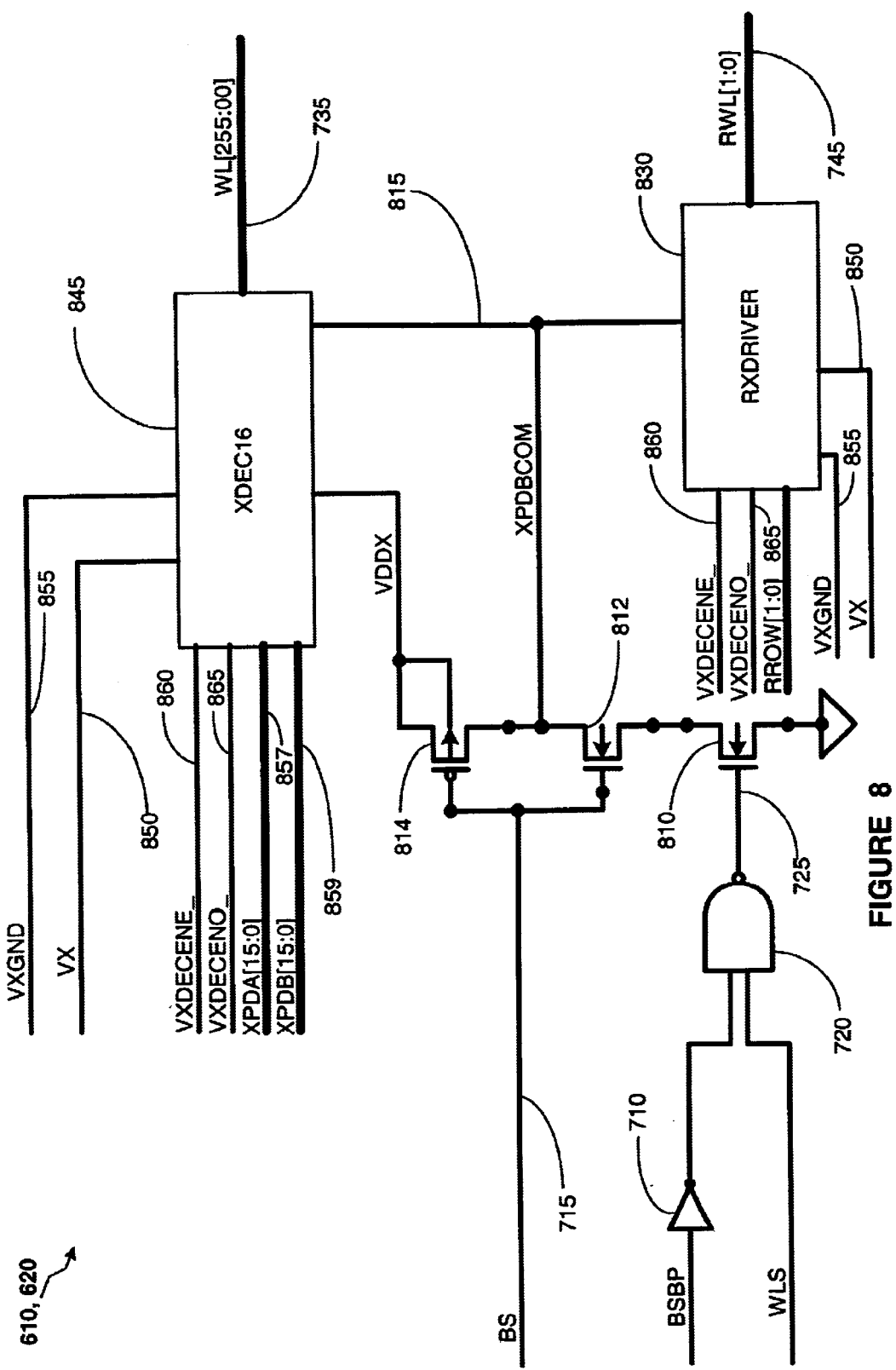
FIGS. 8 and 9 illustrate schematic representations of implementing the address decoder of FIGS. 6 and 7, in accordance with one illustrative embodiment of the present invention.

Turning now to FIG. 8, one embodiment of a circuit that may be implemented as the address decode unit 610, 620 is illustrated. The BSBP signal is sent to an input terminal of the inverter 710. A first input terminal of an NAND gate 720 receives the output signal from the inverter 710. A second input terminal of the NAND gate 720 receives the wordline select WLS signal. An output terminal of the NAND gate 720 provides an output signal that is sent to a gate terminal of an N-channel transistor 810. The assertion of BSBP and WLS causes the NAND gate to assert the select-sector signal on the line 725 to an active low. The BS signal on the line 715 is sent to the gate terminals of a series of transistors, a P-channel transistor 814 and an N-channel transistor 812. The drain of transistor 812 is connected to the source of the N-channel transistor 810. The node connecting the source terminal of transistor 812 and the drain terminal of transistor 814 provides a control signals XPDBCOM on a line 815, which is sent to an XDEC16 block 845 and to an RXDRIVER block 830.

Figure 9:
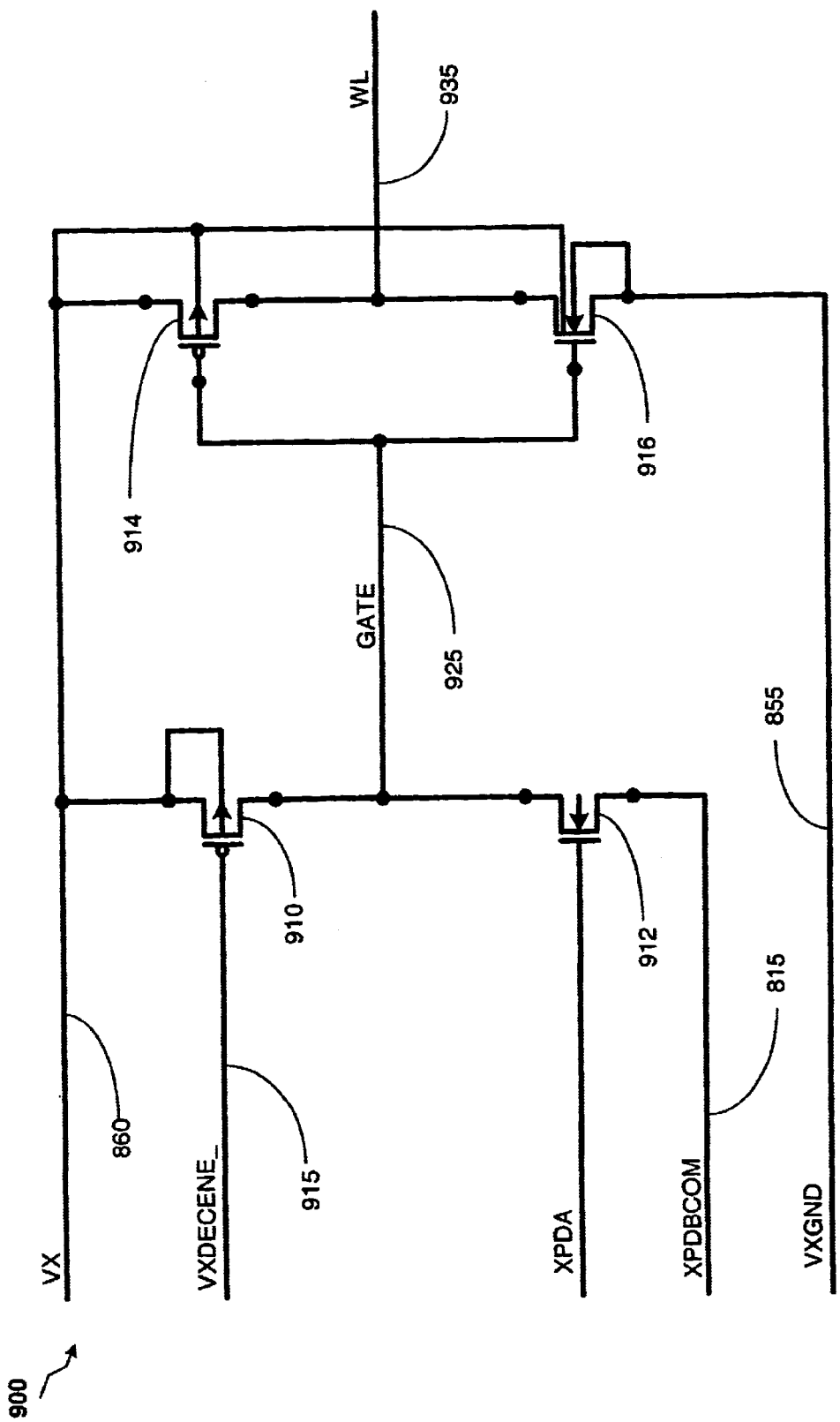

In one embodiment, the XDEC16 and RXDRIVER blocks 830 and 845 comprise a circuit 900 illustrated in FIG. 9. The RXDRIVER block 845 receives a logic high voltage signal (VX) on a line 850 and a logic low signal (VXGND) on a line 855 on its input terminals. The RXDRIVER block 845 also receives ground enable signals VXDECENE_ on a line 860 and VXDECENO_ on a line 865. The logic decode signals XPDA[15:001] on a line 857 and XPDB[15:00] on a line 859 are also provided on input terminals of the block 845. The logic decode signals are used to address particular portions of memory sectors addressed by the address decode unit 610, 620. Using signals received on its input terminals, the block 845 provides a wordline address signal (WL [255:001]) on the line 735 that may select one of 256 wordlines in a memory sector 630, 640. Similarly, the block 830 receives the VXDECENE_signal, the VX signal, the VXGND signal, the XPDBCOM signal, and a row signal (RROW[1:0]) on its input terminals. Based upon signals received on its input terminals, the block 830 provides a row select signal (RWL[1:0]) on the line 745, which is used to select a row 310 in the memory sectors 630, 640.

The assertion of the select-sector signal on the line 725 causes the transistor 810 to turn off, thereby eliminating the path to ground from the signal XPDBCOM on the a line 815. The circuit illustrated in FIG. 9, in combination with the circuit illustrated in FIG. 8, provides a wordline signal that is used to address the wordlines in the memory unit 110. The transistor circuit 900 of FIG. 9 comprises four transistors. A drain terminal of a P-channel transistor 910 is coupled with a source terminal of an N-channel transistor 912. A source terminal of transistor 910 is coupled with the VX signal and a gate terminal of transistor 910 is coupled with the ground enable signal VXDECENE_. A drain terminal of transistor 912 is coupled with the XPDACOM signal and a gate terminal of transistor 912 is coupled with the logic decode signal XPDA.

A node connecting the drain terminal of transistor 910 and the source terminal of transistor 912 provides a GATE signal on a line 925, which is provided to gate terminals of a P-channel transistor 914 and an N-channel transistor 916. A source terminal of transistor 914 is coupled with the VX signal. A drain terminal of transistor 916 is coupled with VXGND, which is a ground signal during the test mode. A node connecting a drain terminal of transistor 914 and a source terminal of transistor 916 provides a wordline select (WL) on a line 935, which provides one of a plurality of wordline select signals that form the signal WL[255:00] on the line 735 of FIG. 8.

Upon assertion of the signal on the line 725 of FIG. 8, the transistor 810 turns off to eliminate the path to ground, which causes the signal XPDBCOM on the line 815 to essentially become a floating signal. This causes the assertion of VXDECENE_signal on a line 915 in FIG. 9, which is a ground enable signal. The VXDENCENE_signal on the line 915 is sent to the gate terminal of transistor 910. The assertion of VXDENCENE_causes the transistor 910 to turn on, thereby causing the GATE signal on the line 925 to go to a logic high state. When the GATE signal on the line 925 goes to a logic high state, transistor 914 turns off, thereby blocking the connection between the WL signal on the line 935 and to the logic high signal VX. The logic high state of the GATE signal on the line 925 also causes transistor 916 to turn on, essentially connecting, or pulling down, the WL signal on the line 935 to the VXGND signal, which is a logic low signal during a testing mode. In other words, when the GATE signal on the line 925 is at logic high, the wordline select signal, WL, on the line 935 is connected to a ground signal through a resistor that has an equivalent resistance of a source-to-drain resistance of transistor 916.

Therefore, the GATE signal on the line 925 going to a logic high, which causes WL signal to be pulled to a logic low level, indicates that the particular wordline is protected. This causes the wordline signal on the line 935 to become asserted low thereby preventing the particular block from receiving the stress voltage. If a particular wordline contains a defect or has been repaired, that particular wordline may be exempted from exposure to a stress voltage using the circuit described above.

Utilizing the circuit provided in FIGS. 8 and 9, the system 100 is able to isolate particular wordlines or sections of memory in the memory unit 110 from receiving the stress voltage and allowing the stress voltage to other selected locations, thereby preserving the integrity of the stress test process. In one embodiment, the stress voltage is applied to alternate wordlines in the memory unit 110. The sector in the memory unit 110 that is controlled or addressed by the circuits illustrated in FIGS. 8 and 9 generally comprise of 256 wordlines by 248 columns. However, other numbers of wordlines and columns may be controlled by a particular sector control circuitry and remain within the spirit and the scope of the present invention.

Figure 10:
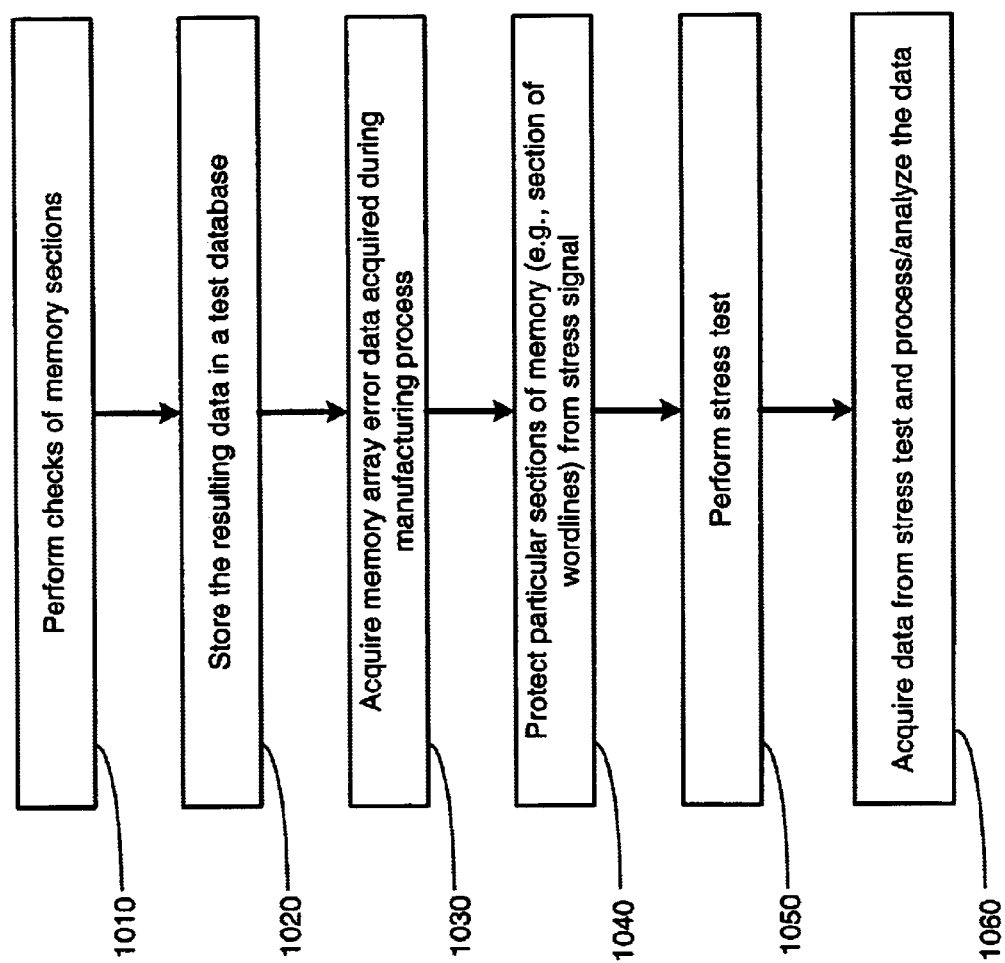
FIG. 10 illustrates a flowchart depiction of one embodiment of the method of performing an alternate wordline test process, in accordance with one illustrative embodiment of the present invention.

Turning now to FIG. 10, a flow chart depiction of methods performed in accordance with embodiments of the present invention are illustrated. The system 100 performs a check of memory sections in the memory unit 110 (block 1010). The checks performed on the memory sections may comprise performing diagnostics and/or testing particular memory locations for electrical shorts and/or the like. The checks may also comprise tabulating other defects or repairs that may exist in particular memory locations. The results from the checks of the memory sections are generally stored into a database, such as the test database 540 (block 1020). The system 100 also acquires memory array error data during the manufacturing process (block 1030). For example, repairs made to particular sections of the memory may be stored and other conditions of the memory may be stored in the memory-array array error database 550.

Based upon the known defects/errors in the memory unit 110, particular sections of the memory, such as a plurality of wordlines, are protected from receiving the stress voltage during the stress test process (block 1040). Subsequently, a stress signal test is performed (block 1050) on the memory unit 110 by applying a test signal to the memory unit 110. For example, alternate wordlines may be exposed to a particular voltage level whereas the non-exposed wordlines may be tied to ground; therefore, a stress voltage is applied to the memory sections in the memory unit 110 by providing a voltage differential between adjacent wordlines.

The data from the stress test is acquired, processed, and analyzed (block 1060) to determine whether there exists additional errors or other problems in the memory unit 110. Utilizing the teachings of the present invention, a more robust memory device is selected and/or certified. The teachings of the present invention may be implemented on a plurality of types of memory devices, such as flash memory, DRAM memory, other volatile and/or non-volatile memory devices.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    identifying a first and second portion of a memory, wherein a stress signal is to be applied to only said second portion of the memory, wherein said first portion contains a fault;
    isolating said first portion of said memory from exposure to a stress signal; and
    providing a stress signal to said second portion of said memory for testing said second portion of memory.

2. The method described in claim 1, further comprising acquiring data relating to said testing said second portion of memory for analysis of said memory.

3. The method described in claim 1, wherein identifying a first and second portion of a memory, wherein a stress signal is to be applied to only said second portion of the memory further comprises determining that a first portion of a memory has at least one of a defect, repair, and a fault.

4. The method described in claim 3, wherein determining that a first portion of a memory has at least one of a defect, repair, and a fault further comprises performing diagnostics upon at least said first portion of said memory.

5. The method described in claim 4, wherein performing diagnostics upon at least said first portion of said memory further comprises determining whether there is an electrical short in said first portion of said memory.

6. The method described in claim 1, wherein determining that said first portion of said memory has at least one of a defect, repair, and a fault further comprises analyzing data from a test database that comprises test data relating to said first portion of said memory.

7. The method described in claim 1, wherein determining that a first portion of a memory has at least one of a defect, repair, and a fault further comprises determining a memory address of said first portion of said memory.

8. The method described in claim 7, wherein isolating said first portion of memory from exposure to a stress signal further comprises preventing an electrical connection between said stress signal and said first portion of said memory based upon said memory address.

9. The method described in claim 1, wherein providing a stress signal to a second portion of said memory for testing said second portion of memory further comprises providing a stress voltage signal to said second portion of said memory.

10. The method described in claim 1, wherein providing a stress signal to a second portion of said memory for testing said second portion of memory further comprises providing a stress voltage signal to a first alternate set of wordlines associated with said second portion of said memory.

11. The method described in claim 10, wherein providing a stress signal to a second portion of said memory for testing said second portion of memory further comprises providing a ground signal to a second alternate set of wordlines associated with said second portion of said memory, wherein a stress voltage level is created across said first set of wordlines and said second set of wordlines.

12. A method, comprising:
    identifying at least one defective wordline in a memory that has at least one of a defect, repair, and a fault;
    determining an address of said defective wordline;
    isolating said defective wordline of said memory from exposure to a stress signal based upon said address of said defective wordline; and
    performing an alternate wordline stress signal test process upon said memory while isolating said defective wordline from said stress signal.

13. The method described in claim 12, wherein identifying at least one defective wordline in a memory further comprises determining whether there is an electrical short in said wordline.

14. The method described in claim 12, wherein isolating said defective wordline of said memory from exposure to said stress signal further comprises preventing an electrical connection between said stress signal and said defective wordline of said memory based upon said address.

15. The method described in claim 12, wherein performing an alternate wordline stress signal test process upon said memory further comprises providing a stress voltage signal to a first alternate set of wordlines associated with said second portion of said memory.

16. The method described in claim 15, wherein performing an alternate wordline stress signal test process upon said memory further comprises providing a ground signal to a second alternate set of wordlines associated with said second portion of said memory, wherein a stress voltage level is created across said first set of wordlines and said second set of wordlines.

17. An apparatus, comprising:
    a memory unit comprising a plurality of memory sectors;
    a stress signal unit operatively coupled to said memory unit, said stress signal unit adapted to provide a stress signal to said memory unit; and
    a controller operatively coupled with said memory unit and said stress signal unit, said processor adapted to perform an alternate memory-sector stress signal test upon said memory unit and isolate at least one memory sector from exposure to said stress signal.

18. The apparatus of claim 17, wherein said memory sector is a wordline.

19. The apparatus of claim 17, wherein said stress signal unit is a voltage source.

20. The apparatus of claim 17, wherein said controller further comprises:
a memory test control unit adapted to receive diagnostic data and evaluate said diagnostic data; and
a memory selection unit operatively coupled to said memory test control unit, said memory selection unit adapted to identify at least one wordline in said memory unit for isolation from said stress signal.

21. The apparatus of claim 20, wherein said memory selection unit further comprising a address decode unit, said address decode unit to identify said wordline to be isolated and provide an address corresponding to said wordline and a control signal to said memory unit for isolating a wordline that corresponds to said address.

22. A system, comprising:
a memory unit comprising a plurality of wordlines;
a stress voltage supply operatively coupled to said memory unit, said stress voltage supply to provide a stress voltage to said memory unit; and
an access unit operatively coupled to said memory unit, said access unit adapted to perform an access of a portion of said memory unit and perform an alternate wordline stress voltage test upon said memory unit while isolating at least one pre-selected wordline, by providing a stress voltage to a plurality of wordlines in said memory unit and isolating said pre-selected wordline.

23. The system of claim 22, wherein said access unit further comprises a controller adapted to identify said pre-selected wordline for isolation from said stress voltage and provide a stress voltage to alternate wordlines in said memory unit.

24. The system of claim 22, wherein said access unit further comprises an address decode unit, said address decode unit to identify said wordline to be isolated and provide an address corresponding to said wordline and a control signal to said memory unit for isolating said wordline that corresponds to said address.

25. An apparatus, comprising:
means for identifying a first and second portion of a memory, wherein a stress signal is to be applied to only said second portion of the memory, wherein said first portion contains a fault;
means for isolating said first portion of said memory from exposure to a stress signal; and
means for providing a stress signal to a second portion of said memory for testing said second portion of memory, wherein said first portion of said memory is isolated from said stress signal.

26. A computer readable program storage device encoded with instructions that, when executed by a computer, performs a method, comprising:
identifying at least one defective wordline in a memory that has at least one of a defect, repair, and a fault;
determining an address of said defective wordline;
isolating said defective wordline of said memory from exposure to a stress signal based upon said address of said defective wordline; and
performing an alternate wordline stress signal test process upon said memory while isolating said defective wordline from said stress signal.

27. The computer readable program storage device encoded with instructions that, when executed by a computer, performs the method described in claim 26, wherein identifying at least one defective wordline in a memory further comprises determining whether there is an electrical short in said wordline.

28. The computer readable program storage device encoded with instructions that, when executed by a computer, performs the method described in claim 26, wherein isolating said defective wordline of said memory from exposure to said stress signal further comprises preventing an electrical connection between said stress signal and said defective wordline of said memory based upon said address.

29. The computer readable program storage device encoded with instructions that, when executed by a computer, performs the method described in claim 26, wherein performing an alternate wordline stress signal test process upon said memory further comprises providing a stress voltage signal to a first alternate set of wordlines associated with said second portion of said memory.

30. The computer readable program storage device encoded with instructions that, when executed by a computer, performs the method described in claim 29, wherein performing an alternate wordline stress signal test process upon said memory further comprises providing a ground signal to a second alternate set of wordlines associated with said second portion of said memory, wherein a stress voltage level is created across said first set of wordlines and said second set of wordlines.

* * * * *